(12) United States Patent　(10) Patent No.: US 12,512,835 B2
Shiomi　(45) Date of Patent: Dec. 30, 2025

(54) HALF-BRIDGE CIRCUIT AND POWER SUPPLY DEVICE

(71) Applicant: SHARP KABUSHIKI KAISHA, Sakai (JP)

(72) Inventor: Takeshi Shiomi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 20 days.

(21) Appl. No.: 18/586,729

(22) Filed: Feb. 26, 2024

(65) Prior Publication Data

US 2024/0305292 A1　Sep. 12, 2024

(30) Foreign Application Priority Data

Mar. 9, 2023　(JP) ................. 2023-036112

(51) Int. Cl.
*H03K 17/687*　(2006.01)
*H03K 17/30*　(2006.01)

(52) U.S. Cl.
CPC ....... *H03K 17/6871* (2013.01); *H03K 17/302* (2013.01); *H03K 2217/0063* (2013.01); *H03K 2217/0072* (2013.01)

(58) Field of Classification Search
CPC ............ H03K 17/6871; H03K 17/302; H03K 2217/0063; H03K 2217/0072
See application file for complete search history.

(56) References Cited

U.S. PATENT DOCUMENTS

2013/0083580 A1* 4/2013 Komiya ................ H02M 1/088
62/132
2019/0386572 A1* 12/2019 Itoh ........................ H02M 1/40

FOREIGN PATENT DOCUMENTS

JP　2013236544 A　11/2013
JP　2016-220468 A　12/2016

* cited by examiner

*Primary Examiner* — Metasebia T Retebo
(74) *Attorney, Agent, or Firm* — ScienBiziP, P.C.

(57) ABSTRACT

A half-bridge circuit includes a series of a first high-voltage MOS, a first low-voltage MOS, a second high-voltage MOS, and a second low-voltage MOS. The half-bridge circuit further includes a capacitor, and the capacitor is connected to the first high-voltage MOS and the second low-voltage MOS. The voltage of the capacitor is greater than 300 V. The drain-to-source withstanding voltage of the first high-voltage MOS is higher than the drain-to-source withstanding voltage of the first low-voltage MOS by 10 times or greater. The voltage of the capacitor is higher than the drain-to-source withstanding voltage of the first low-voltage MOS by 10 times or greater.

3 Claims, 3 Drawing Sheets

HALF-BRIDGE CIRCUIT AND POWER SUPPLY DEVICE

BACKGROUND

1. Field

The following disclosure relates to a half-bridge circuit and a power supply device. The present application claims priority from Japanese Application No. 2023-36112, filed on Mar. 9, 2023, the content of which is hereby incorporated by reference into this application.

2. Description of the Related Art

A reverse recovery current that occurs in a half-bridge circuit produces a switching loss.

Accordingly, studies to reduce a reverse recovery current have been made. Japanese Unexamined Patent Application Publication No. 2016-220468 discloses one example.

SUMMARY

However, even using such a half-bridge circuit still has room for improvement.

The Specification discloses a half-bridge circuit and a power supply device that can reduce a reverse recovery current further than before.

To solve the above problem, a half-bridge circuit according to one aspect of the present disclosure is a half-bridge circuit including a series connection of a first switching circuit and a second switching circuit.

The first switching circuit is a series circuit of a first high-voltage MOS and a first low-voltage MOS configured to perform switching at an identical timing.

The second switching circuit is a series circuit of a second high-voltage MOS and a second low-voltage MOS configured to perform switching at an identical timing.

The drain terminal of the first low-voltage MOS is connected to the source terminal of the first high-voltage MOS.

The drain terminal of the second high-voltage MOS is connected to the source terminal of the first low-voltage MOS.

The drain terminal of the second low-voltage MOS is connected to the source terminal of the second high-voltage MOS.

The half-bridge circuit further includes a capacitor.

The drain terminal of the first high-voltage MOS is connected to the positive electrode of the capacitor.

The source terminal of the second low-voltage MOS is connected to the negative electrode of the capacitor.

The drain-to-source withstanding voltage of the first high-voltage MOS and the drain-to-source withstanding voltage of the second high-voltage MOS are equal.

The drain-to-source withstanding voltage of the first low-voltage MOS and the drain-to-source withstanding voltage of the second low-voltage MOS are equal.

The voltage of the capacitor is greater than 300 V.

The drain-to-source withstanding voltage of the first high-voltage MOS is higher than the drain-to-source withstanding voltage of the first low-voltage MOS by 10 times or greater.

The voltage of the capacitor is higher than the drain-to-source withstanding voltage of the first low-voltage MOS by 10 times or greater.

To solve the above problem, a power supply device according to one aspect of the present disclosure is a power supply device provided with the half-bridge circuit.

The present disclosure enables a reverse recovery current to be reduced further than before.

DESCRIPTION OF THE EMBODIMENTS

First Embodiment

The Specification expresses, for instance, a "half-bridge circuit HB1" also merely as "HB1" in order to simplify the document. An abbreviation that is used is defined as follows. MOS stands for a metal-oxide-semiconductor field-effect transistor.

To reduce a reverse recovery current, studies of circuits have been made as described in Japanese Unexamined Patent Application Publication No. 2016-220468. On the other hand, studies of reducing a reverse recovery current have been made simultaneously in a device, such as a MOS, alone as well. In view of both of these studies, the present disclosure discloses a circuit that is effective to reduce a reverse recovery current.

Configuration of Half-Bridge Circuit That Reduces Reverse Recovery Current

Figure 1:
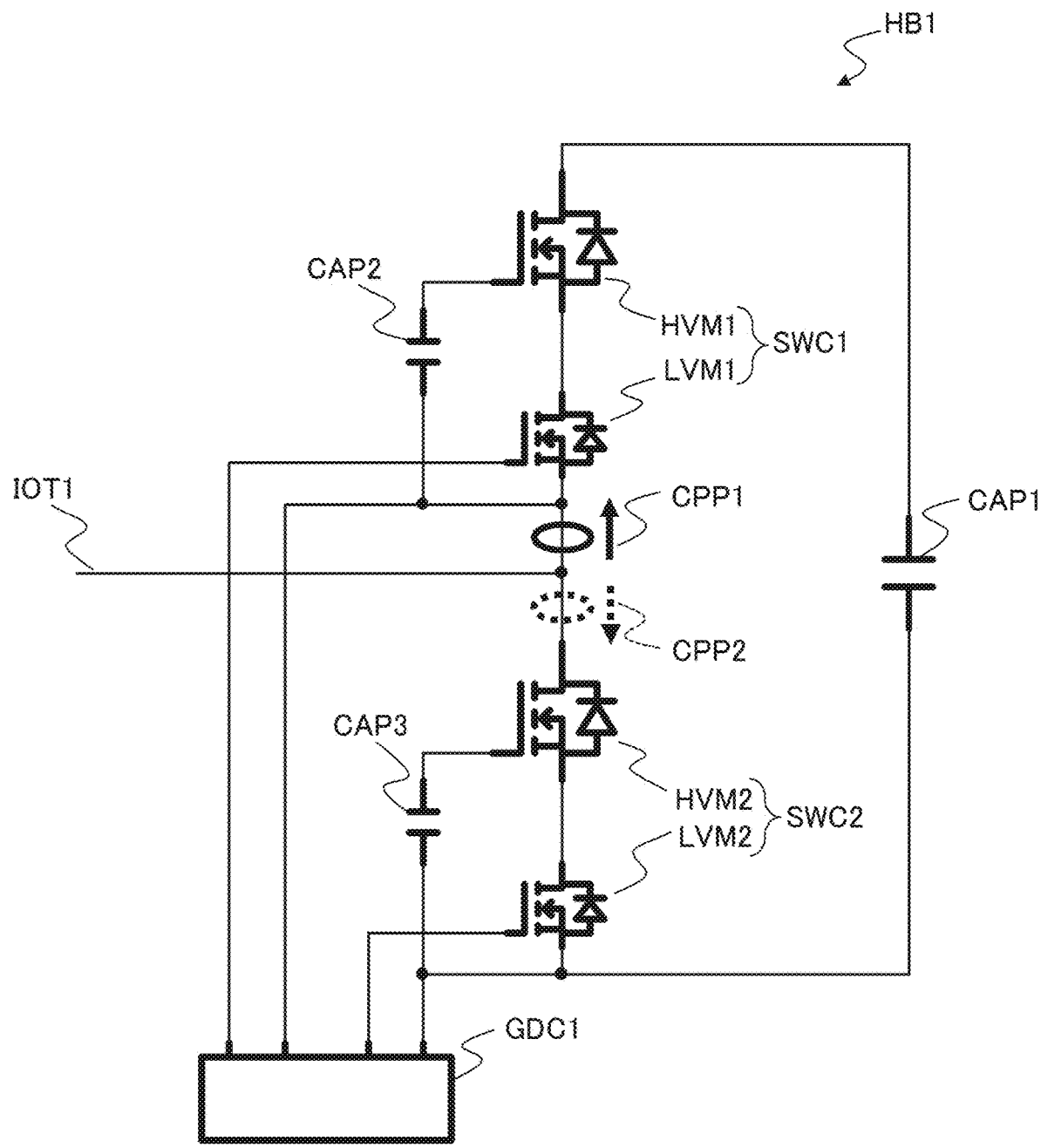
FIG. 1 illustrates a configuration of a half-bridge circuit in the present disclosure.

A configuration of the half-bridge circuit HB1 that reduces a reverse recovery current is illustrated in FIG. 1. In HB1, a first switching circuit SWC1 and a second switching circuit SWC2 are connected in series.

SWC1 is a series circuit of HVM1 and LVM1, which are respectively a first high-voltage MOS and a first low-voltage MOS that perform switching at an identical timing.

SWC2 is a series circuit of HVM2 and LVM2, which are respectively a second high-voltage MOS and a second low-voltage MOS that perform switching at an identical timing.

In the circuit configuration of SWC1, HVM1 subserviently turns on when LVM1 turns on (when its drain-to-source voltage lowers to about 0 V). HVM1 subserviently turns off when LVM1 turns off. HVM1 and LVM1 perform switching at an identical timing with the minor exception that HVM1 turns on/off about 100 nanoseconds behind LVM1. The ON/OFF timing in LVM2 and HVM2 is defined similarly.

The drain terminal of LVM1 is connected to the source terminal of HVM1, the drain terminal of HVM2 is connected to the source terminal of LVM1, and the drain terminal of LVM2 is connected to the source terminal HVM2.

HB1 further includes a capacitor CAP1; the drain terminal of HVM1 is connected to the positive electrode of CAP1, and the source terminal of LVM2 is connected to the negative electrode of CAP1.

The drain-to-source withstanding voltage of HVM1 and the drain-to-source withstanding voltage of HVM2 are equal, and the drain-to-source withstanding voltage of LVM1 and the drain-to-source withstanding voltage of LVM2 are equal. For instance, the drain-to-source withstanding voltages of HVM1 and HVM2 are 600 V, and the drain-to-source withstanding voltages of LVM1 and LVM2 are 40 V.

The reverse recovery time of the parasitic diodes of HVM1 and HVM2 is 100 ns, and the reverse recovery time of the parasitic diodes of LVM1 and LVM2 is 30 ns. The reverse recovery time in LVM1 and LVM2 is faster than the reverse recovery time in HVM1 and HVM2 by 2 times or greater.

The voltage of the CAP1 is greater than 300 V, and in the specific example in this embodiment, the voltage of CAP1 is 400 V. The drain-to-source withstanding voltage of HVM1 is higher than the drain-to-source withstanding voltage of LVM1 by 10 times or greater, and in the specific example in this embodiment, the drain-to-source withstanding voltage of HVM1 is 15 times higher. The voltage of CAP1 is higher than the drain-to-source withstanding voltage of LVM1 by 10 times or greater, and in the specific example in this embodiment, the voltage of CAP1 is 10 times higher.

The gate terminal of HVM1 is connected to the source of LVM1 via a capacitor CAP2. The gate terminal of HVM2 is connected to the source of LVM2 via a capacitor CAP3. The voltages of CAP2 and CAP3 are 15 V and are supplied from an auxiliary power supply APS1 (not shown in FIG. 1; see FIG. 5). HVM1 and HVM2 have a gate threshold voltage of 7 V and can be turned on by 15 V, which is equal to or greater than the threshold voltage. CAP2 and CAP3 can be unnecessary when HVM1 and HVM2 are normally on. The gate terminals of LVM1 and LVM2 are connected to a gate driving circuit GDC1. GDC1 is controlled by a control circuit CNT1 (not shown in FIG. 1; see FIG. 5).

In the case of current feed from HVM1 to LVM1, turning on LVM1 through GDC1 lowers the drain voltage of LVM1, thus turning on HVM1. Further, turning off LVM1 raises the drain voltage of LVM1, thus turning off HVM1. The ON/OFF of LVM2 and HVM2 is defined similarly.

In the case of current feed from LVM1 to HVM1 (in the case of rectification), the gate of LVM1 is off except during a synchronous rectification period. The conduction of the parasitic diode of LVM1 (rectification current, which is forward current) lowers the drain voltage of LVM1, thus turning on HVM1. Further, a flow of a reverse recovery current (a reverse current in response to a reverse voltage) through the parasitic diode of LVM1 raises the drain voltage of LVM1 after a reverse recovery period, thus turning off HVM1. The ON/OFF of LVM2 and HVM2 is defined similarly.

A current measuring point CPP1 is connected to measure the current of SWC1, and a current measuring point CPP2 is connected to measure the current of SWC2. The directions of the arrows denote directions in which a positive current can be measured.

An input-output terminal IOT1 is a terminal for HB1 to input or output a current. An inductive load, such as a coil (not shown), is connected to IOT1.

First Circuit Operation in Half-Bridge Circuit HB1 and Effect of Reducing Reverse Recovery Current HB1 performs a first circuit operation and a second circuit operation. A circuit operation to input a current from IOT1 is defined as the first circuit operation. HB1 can input a current from IOT1 by using a voltage (not shown) through IOT1. A typical voltage raising operation or other things corresponds to this.

Figure 2:
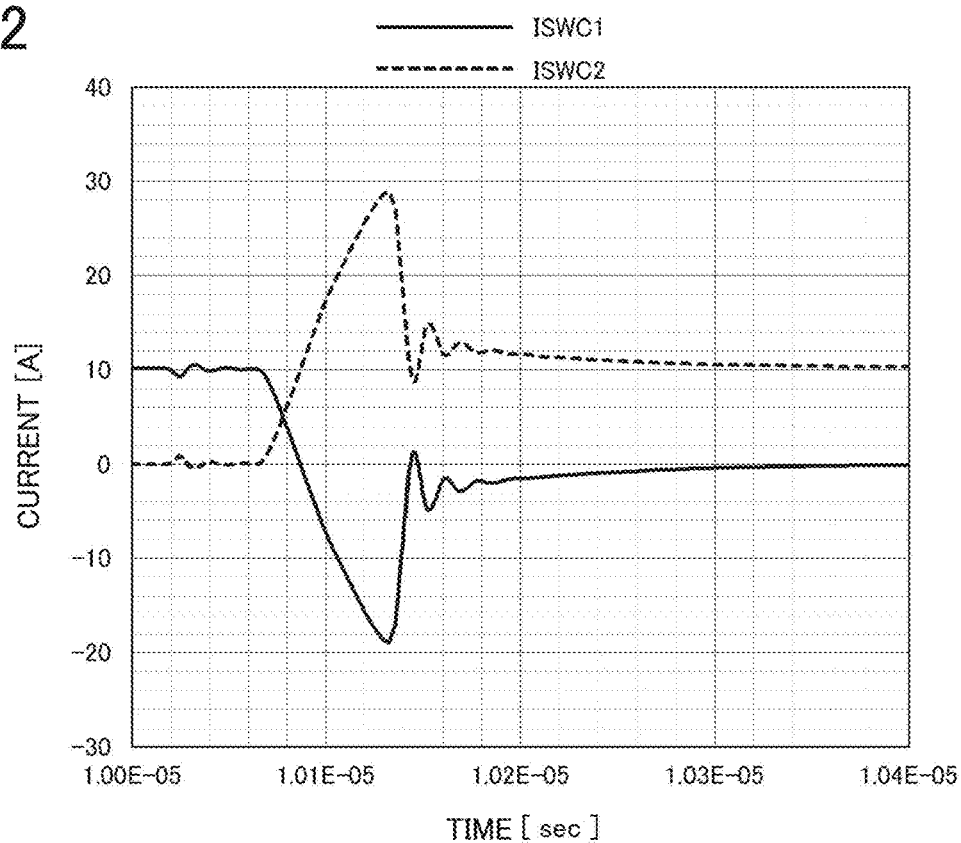
FIG. 2 illustrates a reverse recovery current during a first circuit operation in the half-bridge circuit in the present disclosure.

In the specific first circuit operation, a circuit operation in which SWC1 conducts a current from LVM1 to HVM1, and a circuit operation in which SWC2 conducts a current from HVM2 to LVM2 are alternately performed. FIG. 2 illustrates current switching during the first circuit operation, and a reverse recovery current that occurs at this time.

Figure 3:
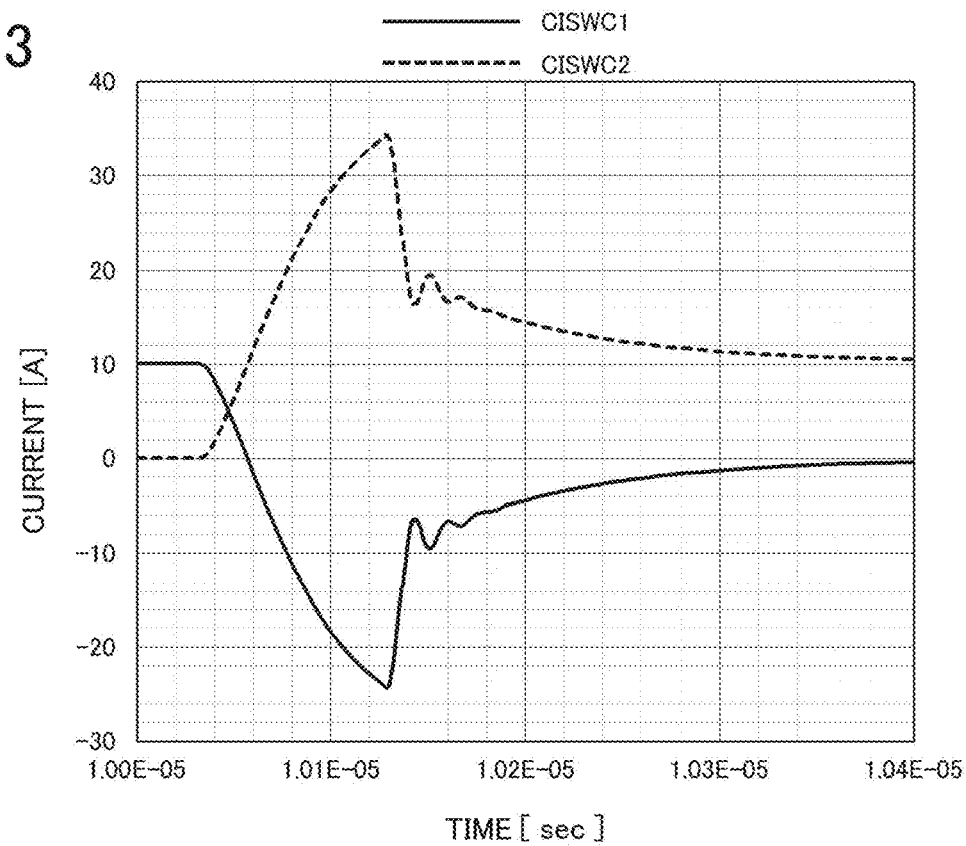
FIG. 3 illustrates a reverse recovery current in a conventional half-bridge circuit.

To confirm the effect of reducing the reverse recovery current of HB1, the reverse recovery current of a conventional half-bridge circuit is illustrated in FIG. 3. The conventional half-bridge circuit is a circuit that includes no LVM1 of HB1 and no LVM2 of HB1, and that turns on/off HVM1 and HVM2 with GDC1 directly.

ISWC1 shown in FIG. 2 is a current measured at CPP1, ISWC2 is a current measured at CPP2. Around Time 1.01E−5 sec., the ON of SWC1 switches the current from ISWC1 that is during rectification operation to ISWC2 that has been turned on. A reverse recovery current of −19 A (ISWC1) flows at this timing.

FIG. 3 illustrates a reverse recovery current that occurs during current switching in a conventional circuit. CISWC1 of the conventional circuit corresponds to ISWC1 of HB1, and CISWC2 of the conventional circuit corresponds to ISWC2 of HB1. CISWC1 of the conventional circuit has a reverse recovery current of −24 A; this reveals that −19 A in ISWC1 of HB1 can prevent the reverse recovery current further.

Second Circuit Operation in Half-Bridge Circuit HB1

HB1 also enables a second circuit operation to output a current to IOT1 by using the voltage of CAP1. A typical voltage lowering operation corresponds to this.

In the specific second circuit operation, a circuit operation in which SWC1 conducts a current from HVM1 to LVM1, and a circuit operation in which SWC2 conducts a current from LVM2 to HVM2 are alternately performed.

Figure 4:
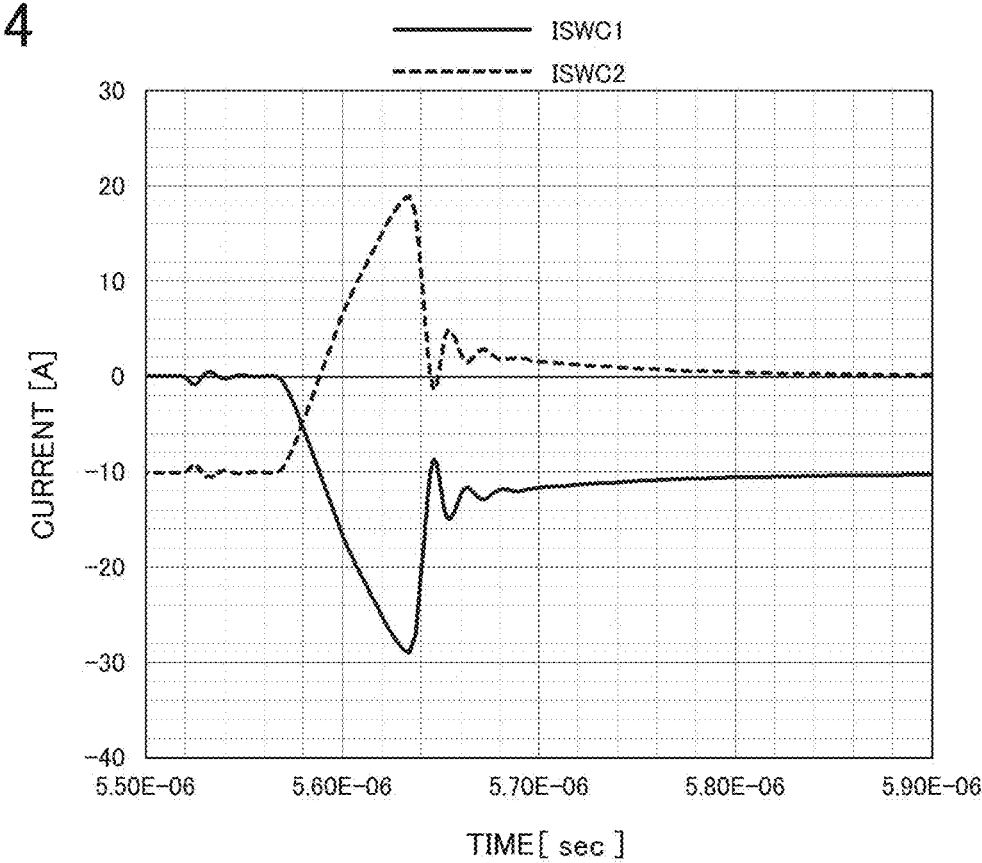
FIG. 4 illustrates a reverse recovery current during a second circuit operation in the half-bridge circuit in the present disclosure.

FIG. 4 illustrates current switching during the second circuit operation, and a reverse recovery current that occurs at this time. In the second circuit operation, the current direction is opposite to that in the first circuit operation, and thus, the operations in SWC1 and SWC2 are also opposite. As such, FIG. 4 is a graph that is upside down with respect to that in FIG. 2. ISWC2 has a reverse recovery current of +19 A, the absolute value of which is equal to that in the first circuit operation.

That equal performance can be achieved in the first circuit operation and second circuit operation is attributed to the same drain-to-source withstanding voltage between HVM1 and HVM2, and to the same drain-to-source withstanding voltage between LVM1 and LVM2. As described above, HB1, which has a configuration directed to SWC1 and SWC2, can reduce the reverse recovery current to the same degree between the first circuit operation and the second circuit operation.

Voltage Specifications in Individual Parts of Half-Bridge Circuit HB1 in the Present Disclosure MOS device developments for reducing a reverse recovery current have been made as well. In particular, a MOS in a 300-volt withstanding voltage class conceivably has much room for improvement in the reduction of the reverse recovery current. As such, the voltage of CAP1, which constitutes a voltage that is applied across HB1, is set to be greater than 300 V so that the effect can be exerted at a higher voltage than 300 V, which is a future problem. Additionally, the drain-to-source withstanding voltage of HVM1 is set to be 10 times or greater of the drain-to-source withstanding voltage of LVM1.

To maximize the effect of HB1 under such device development circumstances, the relationship between the voltage of CAP1 and the drain-to-source withstanding voltage of LVM1 also needs to be focused on. HB1 is configured such that LVM1, which has a less reverse recovery current, takes over the reverse recovery current of HVM1, which has a more reverse recovery current. Additionally, HVM1, which has a high withstanding voltage, protects LVM1, which has a low withstanding voltage, from the voltage of CAP1, which is applied across the circuit. HB1 needs to be operated by a high-voltage circuit as much as possible in order to maximize the effect of reducing the reverse recovery current when compared with other circuit schemes. To be specific, the voltage of CAP1 is preferably 10 times or greater of the drain-to-source withstanding voltage of LVM1.

Second Embodiment

Figure 5:
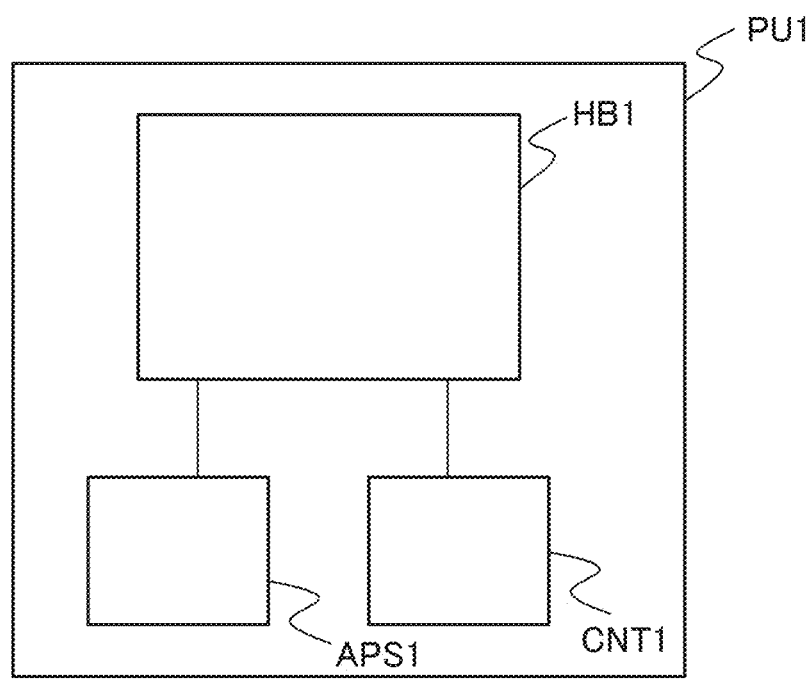
FIG. 5 illustrates a power supply device provided with the half-bridge circuit in the present disclosure.

A power supply device PU1 provided with HB1 is illustrated in FIG. 5. APS1 and CNT1 are connected to HB1 to control the circuit operations in HB1. PU1 can reduce a circuit loss through the effect that is exerted by HB1, i.e., reduction in the reverse recovery current.

It should be noted that each of the foregoing numeric values is a mere example. To adjust the circuit operations, a resistor can be inserted into a wire as appropriate, or a capacitor can be added between wires as appropriate.

Additional Note

While there have been described what are at present considered to be certain embodiments of the invention, it will be understood that various modifications may be made thereto, and it is intended that the appended claim cover all such modifications as fall within the true spirit and scope of the invention.

What is claimed is:

1. A half-bridge circuit comprising a series connection of a first switching circuit and a second switching circuit, wherein:
   the first switching circuit is a first series circuit of a first high-voltage metal oxide semiconductor (MOS) and a first low-voltage MOS configured to perform switching at identical times,
   the second switching circuit is a second series circuit of a second high-voltage MOS and a second low-voltage MOS configured to perform switching at identical times,
   a drain terminal of the first low-voltage MOS is connected to a source terminal of the first high-voltage MOS,
   a drain terminal of the second high-voltage MOS is connected to a source terminal of the first low-voltage MOS,
   a drain terminal of the second low-voltage MOS is connected to a source terminal of the second high-voltage MOS,
   the half-bridge circuit further comprising a first capacitor and a gate driving circuit, wherein:
   a drain terminal of the first high-voltage MOS is connected to a positive electrode of the capacitor,
   a source terminal of the second low-voltage MOS is connected to a negative electrode of the capacitor,
   a drain-to-source withstanding voltage of the first high-voltage MOS and a drain-to-source withstanding voltage of the second high-voltage MOS are equal,
   a drain-to-source withstanding voltage of the first low-voltage MOS and a drain-to-source withstanding voltage of the second low-voltage MOS are equal,
   a voltage of the capacitor is greater than 300 V,
   the drain-to-source withstanding voltage of the first high-voltage MOS is higher than the drain-to-source withstanding voltage of the first low-voltage MOS by 10 times or greater,
   the voltage of the capacitor is higher than the drain-to-source withstanding voltage of the first low-voltage MOS by 10 times or greater,
   the first low-voltage MOS and the second low-voltage MOS are configured to undergo ON/OFF controls by the gate driving circuit,
   a gate terminal of the first high-voltage MOS is connected to the source terminal of the first low-voltage MOS directly or via a second capacitor,
   a gate terminal of the second high-voltage MOS is connected to the source terminal of the second low-voltage MOS directly or via a third capacitor, and
   the gate terminals of the first high-voltage MOS and the second high-voltage MOS are configured to undergo ON/OFF controls without being controlled by the gate driving circuit.

2. The half-bridge circuit according to claim 1, further including a first circuit operation and a second circuit operation, wherein:
   in the first circuit operation,
   a circuit, in which the first switching circuit conducts a current from the first low-voltage MOS to the first high-voltage MOS, and another circuit operation, in which the second switching circuit conducts a current from the second high-voltage MOS to the second low-voltage MOS, are alternately performed, and
   in the second circuit operation,
   a circuit operation, in which the first switching circuit conducts a current from the first high-voltage MOS to the first low-voltage MOS, and another circuit operation, in which the second switching circuit conducts a current from the second low-voltage MOS to the second high-voltage MOS, are alternately performed.

3. A power supply device comprising the half-bridge circuit according to claim 1.

* * * * *